(12) United States Patent
Fukuda

(10) Patent No.: US 8,872,950 B2
(45) Date of Patent: Oct. 28, 2014

(54) IMAGE SENSOR AND IMAGE-CAPTURING APPARATUS WITH IMAGING PIXEL AND FOCUSING PIXEL HAVING LIGHT SHIELD LAYERS INCLUDING OPENINGS

(75) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 305 days.

(21) Appl. No.: 13/424,865

(22) Filed: Mar. 20, 2012

(65) Prior Publication Data

US 2012/0249852 A1 Oct. 4, 2012

(30) Foreign Application Priority Data

Mar. 31, 2011 (JP) .................................. 2011-079799

(51) Int. Cl.
| | |
|---|---|
| H04N 3/14 | (2006.01) |
| H04N 5/335 | (2011.01) |
| G03B 13/00 | (2006.01) |
| H04N 5/232 | (2006.01) |
| H04N 5/369 | (2011.01) |
| H01L 27/146 | (2006.01) |
| H04N 9/04 | (2006.01) |
| H04N 5/225 | (2006.01) |

(52) U.S. Cl.
CPC ........ *H01L 27/14623* (2013.01); *H04N 5/3696* (2013.01); *H04N 9/045* (2013.01); *H04N 5/232* (2013.01); *H01L 27/1461* (2013.01); *H04N 5/2256* (2013.01); *H01L 27/14605* (2013.01); *H01L 27/1463* (2013.01)
USPC ......................................... 348/294; 348/350

(58) Field of Classification Search
CPC  H04N 5/2254; H04N 5/23212; H04N 5/2253
USPC ......... 348/302, 311, 315, 335, 340, 294, 345, 348/350
See application file for complete search history.

(56) References Cited

U.S. PATENT DOCUMENTS 5,942,774 A * 8/1999 Isogai et al. .................. 257/292
2010/0073527 A1 3/2010 Ichimiya
(Continued)

FOREIGN PATENT DOCUMENTS

| | | |
|---|---|---|
| CN | 101896863 A | 11/2010 |
| JP | 2000-156823 | 6/2000 |
| JP | 2004-320270 | 11/2004 |
| JP | 2010-219958 A | 9/2010 |

OTHER PUBLICATIONS

The above foreign patent documents were cited in a Aug. 8, 2014 Chinese Office Action, a copy of which is enclosed with an English Translation, that issued in Chinese Patent Application No. 201210096434.7.

*Primary Examiner* — Nicholas Giles
(74) *Attorney, Agent, or Firm* — Cowan, Liebowitz & Latman, P.C.

(57) ABSTRACT

The capacitance of a charge-accumulating layer of an imaging pixel is made different from that of a charge-accumulating layer of a focusing pixel, thereby reducing the difference in saturation capacitance due to the difference between the light-reception efficiencies of the imaging pixel and the focusing pixel. The ratio between the capacitance of the charge-accumulating layer of the imaging pixel and that of the charge-accumulating layer of the focusing pixel is determined in consideration of a variation in ratio between the light-reception efficiencies of the imaging pixel and the focusing pixel with a change in at least one of the exit pupil distance and the aperture value.

5 Claims, 12 Drawing Sheets

(56) References Cited

U.S. PATENT DOCUMENTS

| | | |
|---|---|---|
| 2010/0157094 A1 | 6/2010 | Takamiya |
| 2010/0253857 A1* | 10/2010 | Sugisaka et al. .............. 348/725 |
| 2011/0279734 A1* | 11/2011 | Tsubata ........................ 348/731 |
| 2011/0279735 A1* | 11/2011 | Tsubata ........................ 348/731 |

* cited by examiner

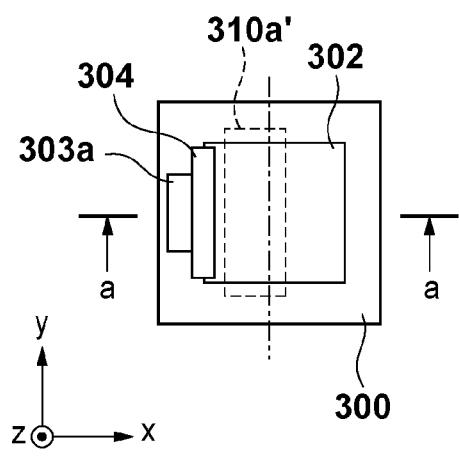
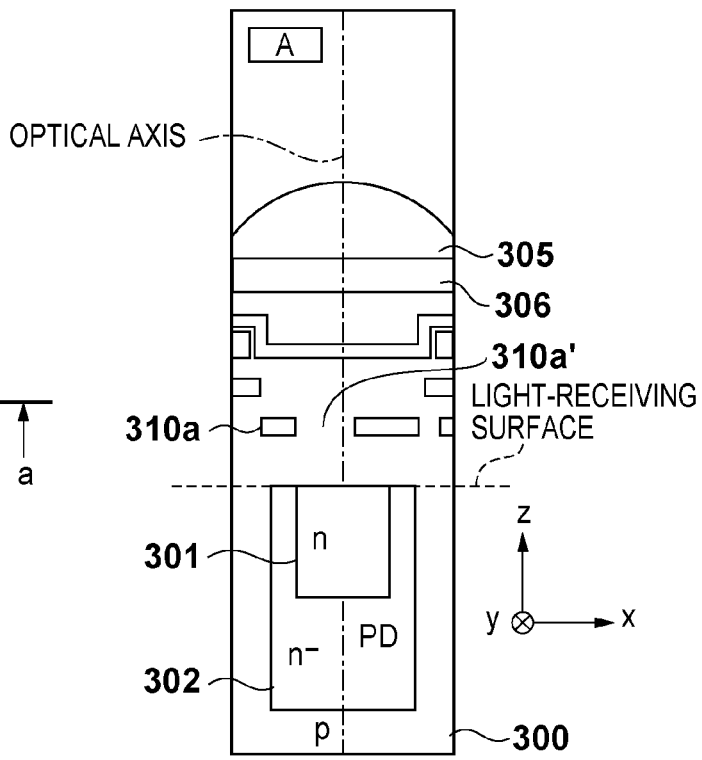
PLAN VIEW
FIG. 3A
SECTIONAL VIEW TAKEN ALONG CROSS-SECTION a–a
FIG. 3B

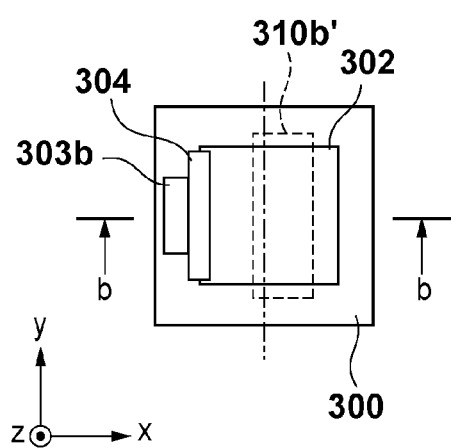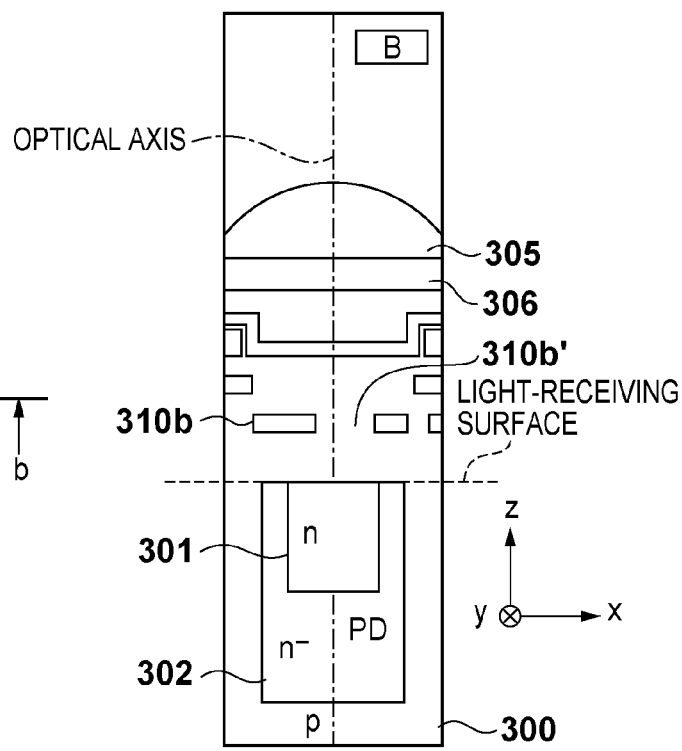
PLAN VIEW
FIG. 4A
SECTIONAL VIEW TAKEN ALONG CROSS-SECTION b–b
FIG. 4B

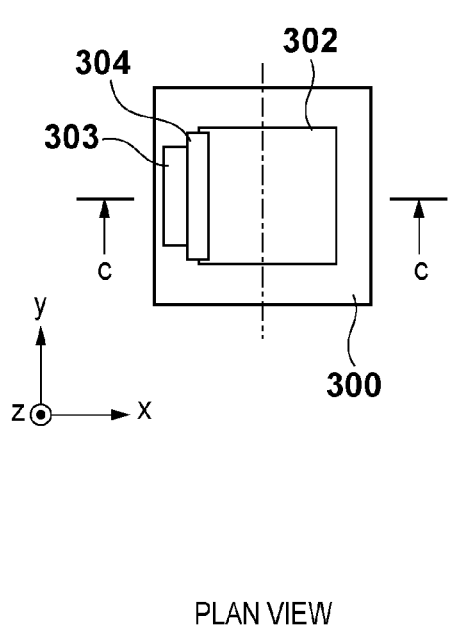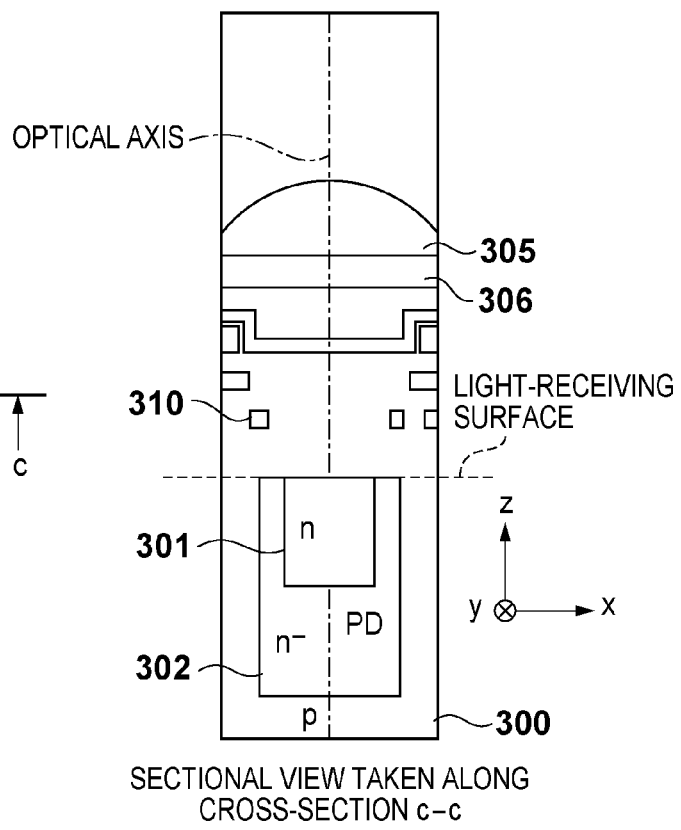
PLAN VIEW
F I G. 5A
SECTIONAL VIEW TAKEN ALONG
CROSS-SECTION c-c
F I G. 5B

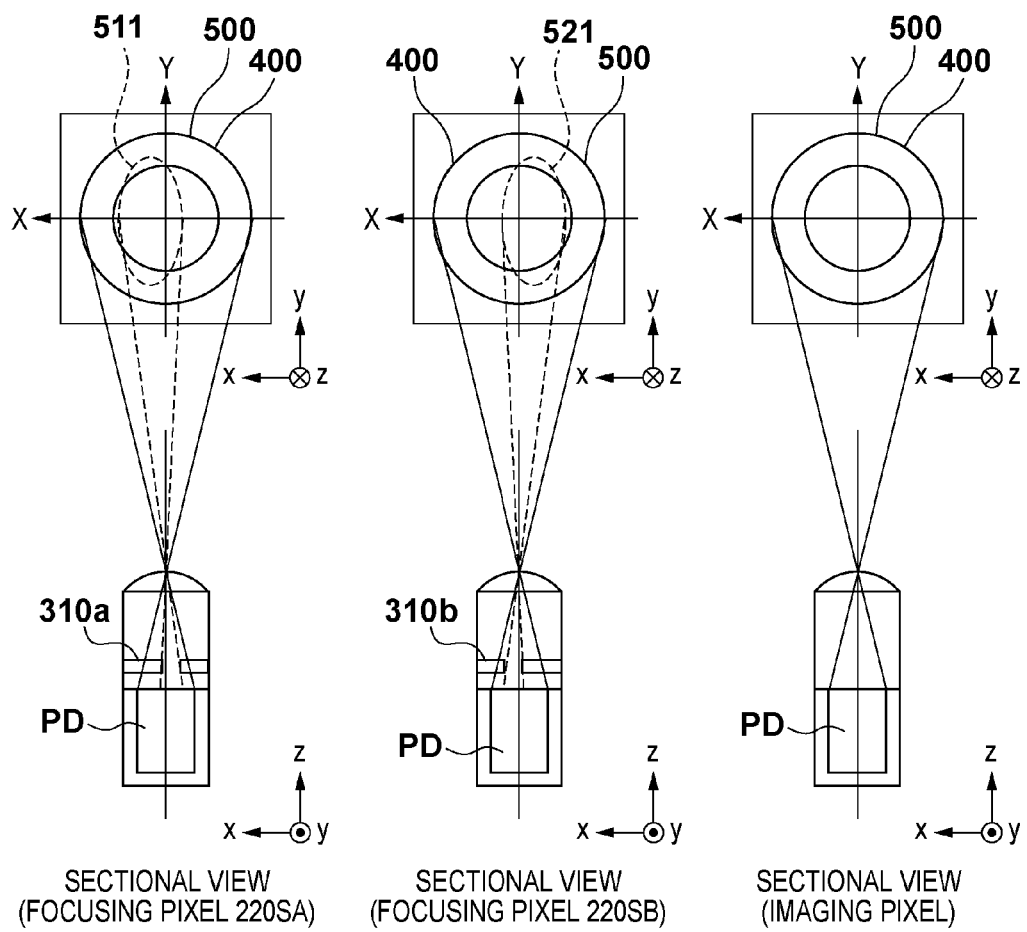
F I G. 7A    F I G. 7B    F I G. 7C

PUPIL DIVISION

PUPIL INTENSITY DISTRIBUTION

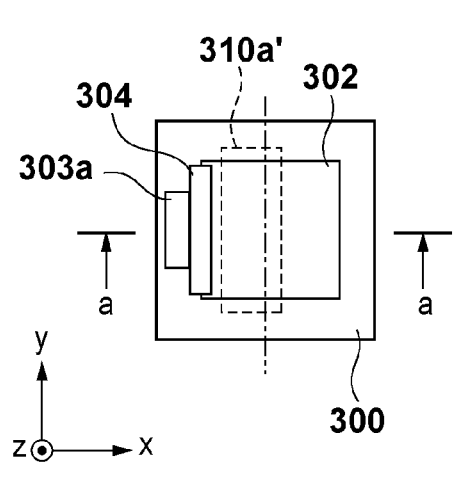
PLAN VIEW
F I G. 13A
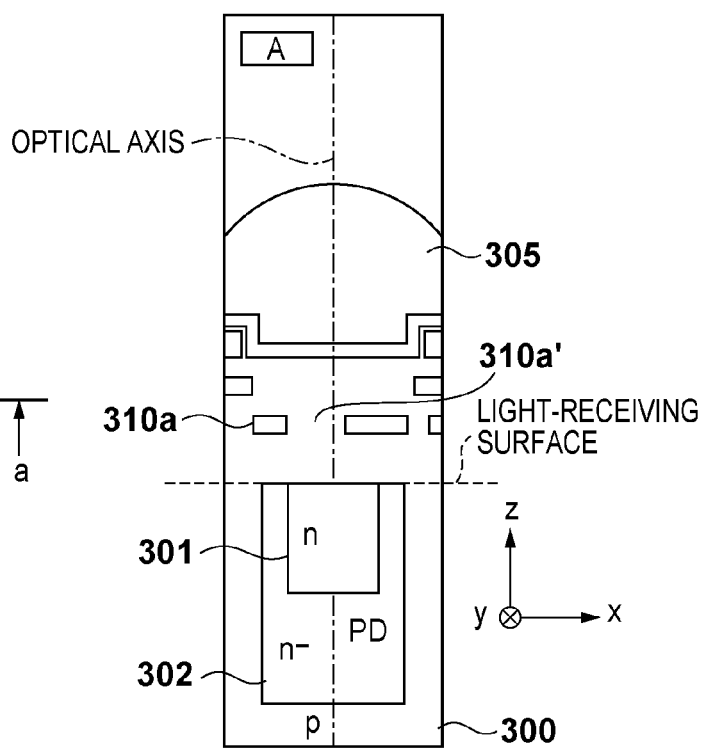
SECTIONAL VIEW TAKEN ALONG
CROSS-SECTION a-a
F I G. 13B

IMAGE SENSOR AND IMAGE-CAPTURING APPARATUS WITH IMAGING PIXEL AND FOCUSING PIXEL HAVING LIGHT SHIELD LAYERS INCLUDING OPENINGS

BACKGROUND OF THE INVENTION

1. Field of the Invention

The present invention relates to an image sensor and an image-capturing apparatus.

2. Description of the Related Art

There has been proposed an image-capturing apparatus which performs focus detection of an imaging lens by the phase-difference detection method using a two-dimensional image sensor including pixels each having a microlens formed in it.

Japanese patent Laid-Open No. 2000-156823 discloses an image-capturing apparatus including a plurality of pairs of focusing pixels arranged on a two-dimensional image sensor including a plurality of pixels. One pair of focusing pixels are configured to receive light fluxes from different areas in the exit pupil of the imaging lens using a light-shielding layer including an opening, thereby performing pupil division. Imaging signals are obtained by imaging pixels arranged in most parts of the two-dimensional image sensor, and a defocus amount is obtained based on signals from focusing pixels arranged in some parts of this image sensor, thereby allowing focus detection.

Also, Japanese Patent Laid-Open No. 2004-320270 discloses a CCD (image sensor) including low- and high-sensitivity photodiodes. In Japanese Patent Laid-Open No. 2004-320270, the capacitance of a floating diffusion (charge-accumulating layer) of a source follower circuit (amplifier circuit) is varied between the low- and high-sensitivity photodiodes, thereby reducing the difference in signal strength.

The focusing pixels described in Japanese Patent Laid-Open No. 2000-156823 partially shield light fluxes having passed through the exit pupil of the imaging lens using the light-shielding layer formed in the image sensor, thereby performing pupil division. Because the light-shielding layer does not influence any imaging pixel, the imaging pixel has a transmittance and light-reception efficiency higher than the focusing pixels. Therefore, a difference in saturation capacitance is generated between the imaging pixel and the focusing pixel.

To cope with this difference, the capacitances of floating diffusions of source follower circuits formed in the imaging pixel and the focusing pixel, respectively, can be made different.

However, the position of center of gravity of an area (pupil area) exhibiting a given pupil intensity distribution varies between the focusing pixel and the imaging pixel. Hence, the light-reception efficiency ratio between the focusing pixel and the imaging pixel is not constant, and varies considerably depending on, for example, the exit pupil distance (the distance from the exit pupil to the imaging surface) and a change in setting (aperture value) of an imaging optical system. This means that the difference in saturation capacitance between the imaging pixel and the focusing pixel cannot be sufficiently reduced simply by varying the capacitance of a floating diffusion in each individual type of pixel.

SUMMARY OF THE INVENTION

The present invention has been made in consideration of the above-mentioned conventional problem, and provides an image sensor which includes imaging pixels and focusing pixels having saturation capacitances with less differences.

The first aspect of the present invention provides an image sensor comprising: an imaging pixel which includes a first charge-accumulating layer and receives a light flux that passes through a first pupil area of an imaging optical system, and a focusing pixel which includes a second charge-accumulating layer and receives a light flux that passes through a second pupil area of the imaging optical system, wherein the focusing pixel further comprises a light-shielding layer which includes an opening and is formed therein so that the first pupil area is larger than the second pupil area, and the first pupil area has a position of center of gravity different from a position of center of gravity of the second pupil area, and wherein a ratio between a capacitance of the first charge-accumulating layer and a capacitance of the second charge-accumulating layer has a value determined in accordance with one of an average value and a value closest to one, of a ratio between light-reception efficiency of the imaging pixel and light-reception efficiency of the focusing pixel, the ratio varies depending on a change in at least one of an exit pupil distance and an aperture value of the imaging optical system.

The second aspect of the present invention provides an image-capturing apparatus comprising an image sensor defined as the first aspect of the present invention.

Further features of the present invention will become apparent from the following description of exemplary embodiments with reference to the attached drawings.

BRIEF DESCRIPTION OF THE DRAWINGS

FIGS. 3A and 3B are a plan view and vertical sectional view, respectively, of a focusing pixel 220SA of the image sensor in the first embodiment of the present invention;

FIGS. 4A and 4B are a plan view and vertical sectional view, respectively, of a focusing pixel 220SB of the image sensor in the first embodiment of the present invention;

FIGS. 5A and 5B are a plan view and vertical sectional view, respectively, of an imaging pixel of the image sensor in the first embodiment of the present invention;

FIGS. 7A to 7C are views for explaining the relationships between the exit pupil plane of an imaging optical system and vertical cross-sections of the imaging pixel and the two types of focusing pixels of the image sensor in the first embodiment of the present invention;

FIGS. 13A and 13B are a plan view and vertical sectional view, respectively, of a focusing pixel 220SA in the second embodiment of the present invention.

DESCRIPTION OF THE EMBODIMENTS

Exemplary embodiments of the present invention will now be described in detail in accordance with the accompanying drawings.

First Embodiment

Figure 1:
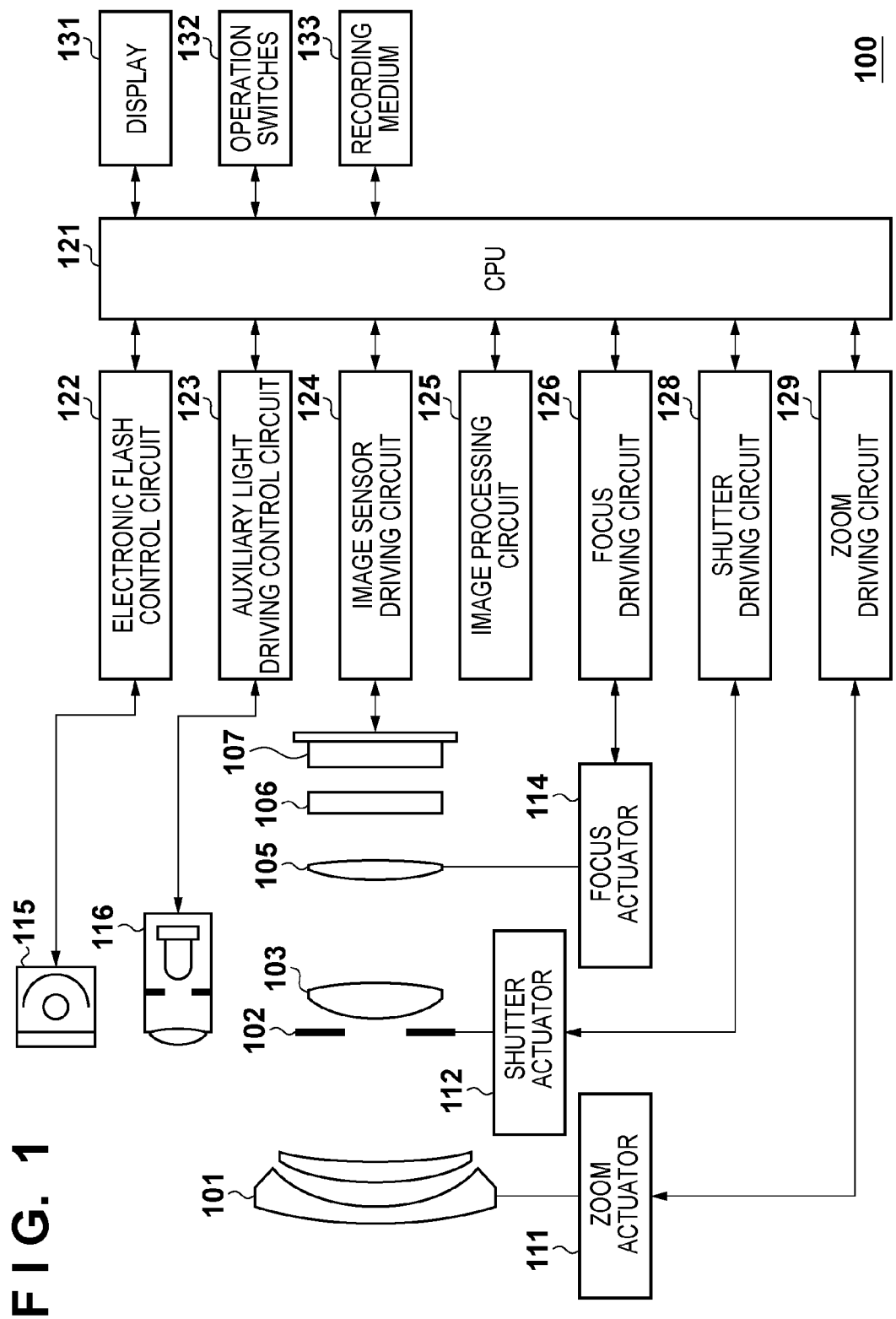
FIG. 1 is a block diagram illustrating an example of the functional configuration of a digital still camera which exemplifies an image-capturing apparatus using an image sensor according to the first embodiment of the present invention.

FIG. 1 is a block diagram illustrating an example of the functional configuration of a digital still camera 100 (to be simply referred to as a camera 100 hereinafter) which exemplifies an image-capturing apparatus using an image sensor according to the first embodiment of the present invention.

A first lens group 101 is placed at the distal end of an image-capturing optical system (imaging optical system) and held to be movable back and forth along the optical axis. A shutter 102 functions not only as a shutter which controls the exposure time in capturing a still image, but also as an aperture stop which adjusts the opening size to adjust the amount of light in capturing an image. A second lens group 103 placed on the back side (image sensor side) of the shutter 102 can move back and forth along the optical axis together with the shutter 102, and implements a zoom function together with the first lens group 101.

A third lens group 105 serves as focus lenses and can move back and forth along the optical axis. An optical lowpass filter 106 is placed in front of an image sensor 107 and reduces any false color and moire generated in a captured image. The image sensor 107 is formed by a two-dimensional CMOS image sensor and its peripheral circuit. In this embodiment, the image sensor 107 is a two-dimensional single-plate color image sensor formed by two-dimensionally arraying m (horizontal)×n (vertical) light-receiving elements (pixels) including primary color mosaic filters arranged in a Bayer pattern. The color filters limit the wavelengths of transmitted light incident on the light-receiving elements for each pixel.

A zoom actuator 111 pivots a cam cylinder (not shown) to drive at least one of the first lens group 101 and the third lens group 105 in accordance with control of a zoom driving circuit 129, thereby implementing a zoom (scaling) function. A shutter actuator 112 controls the opening size of the shutter 102 to adjust the amount of image-capturing light in accordance with control of a shutter driving circuit 128, and controls the exposure time in capturing a still image.

A focus actuator 114 drives the third lens group 105 along the optical axis in accordance with control of a focus driving circuit 126.

An electronic flash 115 can serve as an electronic flush illumination device which uses a xenon tube, but may serve as an illumination device including an LED which continuously emits light. An AF auxiliary light output unit 116 projects an image of a mask having a predetermined opening pattern to the field via a light-projecting lens to improve the focus detection capability for low-luminance objects and low-contrast objects.

A CPU 121 controls the operation of the overall camera 100 and includes, for example, an arithmetic unit, ROM, RAM, A/D converter, D/A converter, and communication interface circuit (none is shown). The CPU 121 executes programs stored in the ROM to control various circuits provided in the camera 100, thereby implementing the functions of the camera 100, such as AF, AE, image processing, and recording.

An electronic flash control circuit 122 ON/OFF-controls the electronic flash 115 in synchronism with the image-capturing operation. An auxiliary light driving control circuit 123 ON/OFF-controls the AF auxiliary light output unit 116 in the focus detection operation. An image sensor driving circuit 124 controls the operation of the image sensor 107, A/D-converts an image signal read out from the image sensor 107, and outputs the obtained image signal to the CPU 121. An image processing circuit 125 applies various types of image processing such as gamma conversion, color compensation, and JPEG encoding to an image signal.

The focus driving circuit 126 drives the focus actuator 114 based on the focus detection result to move the third lens group 105 along the optical axis, thereby performing focus adjustment. The shutter driving circuit 128 drives the shutter actuator 112 to control its opening size and opening/closing timing of the shutter 102. A zoom driving circuit 129 drives the zoom actuator 111 in accordance with a zoom operation input from the photographer upon pressing of, for example, a zoom operation switch included in operation switches 132.

A display 131 serves as, for example, an LCD and displays, for example, information associated with the image-capturing mode of the camera 100, a preview image before capturing an image, a confirmation image after capturing an image, and information of the focus state in focus detection. The operation switches 132 include, for example, a power supply switch, release (image-capturing trigger) switch, zoom operation switch, and image-capturing mode selection switch. A recording medium 133 serves as, for example, a detachable semiconductor memory card and records a captured image.

(Pixel Array of Image Sensor)

Figure 2:
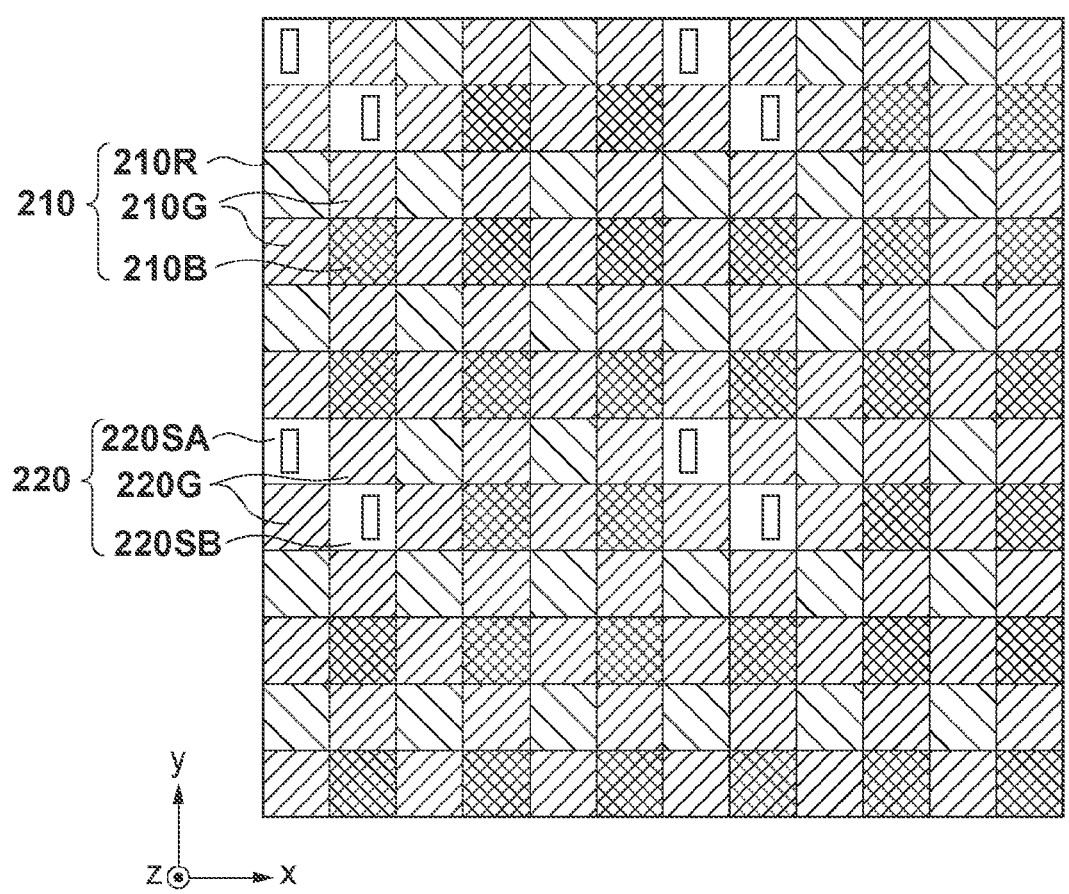
FIG. 2 is a view illustrating an example of the pixel array of the image sensor in the first embodiment of the present invention.

FIG. 2 is a view illustrating an example of the pixel array of the image sensor 107 in the range of 12 (columns)×12 (rows) pixels in this embodiment. Pixels are arranged on the image-capturing screen of the image sensor 107 in the same pattern. In this embodiment, the size of the image-capturing screen of the image sensor 107 is 22.3 mm (horizontal)×14.9 mm (vertical), the pixel pitch is 4 µm, and the number of effective pixels is 5575 (rows)×3725 (columns)=about 20 million.

The pixels of the image sensor 107 are formed by 2 (rows)×2 (columns) imaging pixels 210 and (rows)×2 (columns) focusing pixels 220, as shown in FIG. 2. The imaging pixels 210 include imaging pixels 210G which are arranged as two diagonal pixels and have a spectral sensitivity of G (Green), an imaging pixel 210R which is arranged as one of the remaining two pixels and has a spectral sensitivity of R (Red), and an imaging pixel 210B which is arranged as the other of the remaining two pixels and has a spectral sensitivity of B (Blue). Also, the focusing pixels 220 include imaging pixels 220G which are arranged as two diagonal pixels and have a spectral sensitivity of G, and focusing pixels 220SA and 220SB arranged as the remaining two pixels. The focusing pixels 220SA and 220SB have a spectral sensitivity of G (Green) in this embodiment, as will be described later.

FIG. 3A is a plan view of the focusing pixel 220SA when viewed from the side of the light-receiving surface of the image sensor 107 (+z side), and FIG. 3B is a sectional view taken along a cross-section a-a in FIG. 3A when viewed from the −y side. Also, FIG. 4A is a plan view of the focusing pixel 220SB when viewed from the side of the light-receiving surface of the image sensor 107 (+z side), and FIG. 4B is a sectional view taken along a cross-section b-b in FIG. 4A when viewed from the −y side. Moreover, FIG. 5A is a plan view of one imaging pixel 220G of the image sensor 107 shown in FIG. 2 when viewed from the side of the light-receiving surface of the image sensor 107 (+z side), and FIG. 5B is a sectional view taken along a cross-section c-c in FIG. 5A when viewed from the −y side. Note that FIGS. 3B, 4B, and 5B do not illustrate transfer gates 304 and n+ floating diffusions (n-type charge-accumulating layers) 303a, 303b, and 303 for the sake of simplicity.

A photodiode (photoelectric conversion unit) PD having a pin structure in which an n-intrinsic layer 302 is sandwiched between a p-type layer 300 and an n-type layer 301 is formed in the focusing pixel 220SA, as shown in FIG. 3B. The photoelectric conversion unit PD of the focusing pixel 220SA has the region of a depletion layer formed in the n-intrinsic layer 302 shown in FIG. 3B and its surrounding region corresponding to the distance across which minority carriers diffuse, and therefore has a region nearly equal in area to the total area of the n-intrinsic layer 302 and the n-type layer 301. The n-intrinsic layer 302 may be replaced with a pn junction photodiode as needed. The same applies to the focusing pixel 220SB and imaging pixels 220G, 210R, 210G, and 210B.

A microlens 305 for converging incident light is formed on the light-reception side of each pixel in this embodiment, as shown in FIGS. 3B, 4B, and 5B. Also, a color filter 306 for performing color separation by selecting a light-reception wavelength is formed on the side of the microlens 305 with respect to the photoelectric conversion unit PD. As described above, in this embodiment, G filters are formed in the focusing pixels 220SA and 220SB and imaging pixel 220G. Similarly, an R filter is formed in the imaging pixel 210R, a G filter is formed in the imaging pixel 210G, and a B filter is formed in the imaging pixel 210B. Filters of other colors may be formed as needed. Alternatively, a W (White) pixel may be used instead of forming a color filter.

In the focusing pixel 220SA shown in FIGS. 3A and 3B, a light-shielding layer 310a having an opening 310a' is formed between the microlens 305 and the photoelectric conversion unit PD for pupil division. The center of gravity of the opening 310a' in the light-shielding layer 310a is shifted in the −x direction with respect to that of the light-receiving surface of the photoelectric conversion unit PD. The opening 310a' in the light-shielding layer 310a is indicated by a broken line in FIG. 3A.

On the other hand, in the focusing pixel 220SB shown in FIGS. 4A and 4B, a light-shielding layer 310b having an opening 310b' is formed between the microlens 305 and the photoelectric conversion unit PD for pupil division. The center of gravity of the opening 310b' in the light-shielding layer 310b is shifted in the +x direction with respect to that of the light-receiving surface of the photoelectric conversion unit PD. The opening 310b' in the light-shielding layer 310b is indicated by a broken line in FIG. 4A.

Although the light-shielding layers 310a and 310b having the openings 310a' and 310b', respectively, also serve as interconnection layers in the first embodiment, interconnection layers and light-shielding layers may be formed separately.

Also, in the focusing pixels 220SA and 220SB, the n-type charge-accumulating layers 303a and 303b serving as second charge-accumulating layers are connected to the photoelectric conversion units PD via the transfer gates 304, as shown in FIGS. 3A and 4A. Similarly, in the imaging pixel 220G, the n-type charge-accumulating layer 303 serving as a first charge-accumulating layer is connected to the photoelectric conversion unit PD via the transfer gate 304, as shown in FIG. 5A.

Light incident on the imaging pixel 220G shown in FIGS. 5A and 5B is converged by the microlens 305 and received by the photoelectric conversion unit PD. In the photoelectric conversion unit PD, electron-hole pairs are generated in correspondence with the amount of incident light, and are dissociated by a depletion layer. Then, the negatively charged electrons are accumulated in the n-type layer 301, while the positively charged holes are discharged outside the image sensor 107 via the p-type layer 300 connected to a constant voltage source (not shown).

On the other hand, light incident on the focusing pixels 220SA and 220SB shown in FIGS. 3A and 3B and 4A and 4B, respectively, is converged by the microlenses 305, and a certain component of the converged light passes through the openings in the light-shielding layers 310a and 310b and is received by the photoelectric conversion units PD. This means that the imaging pixel 220G has a light transmittance higher than those of the focusing pixels 220SA and 220SB, that is, a light-reception efficiency better than those of the latter.

Therefore, when the imaging pixel 220G and focusing pixels 220SA and 220SB include color filters having the same spectral transmittance and receive the same amount of incident light, charges $Q_{IMG}$ generated by the imaging pixel 220G are larger in amount than charges $Q_{AF}$ generated by each of the focusing pixels 220SA and 220SB.

Figure 6:
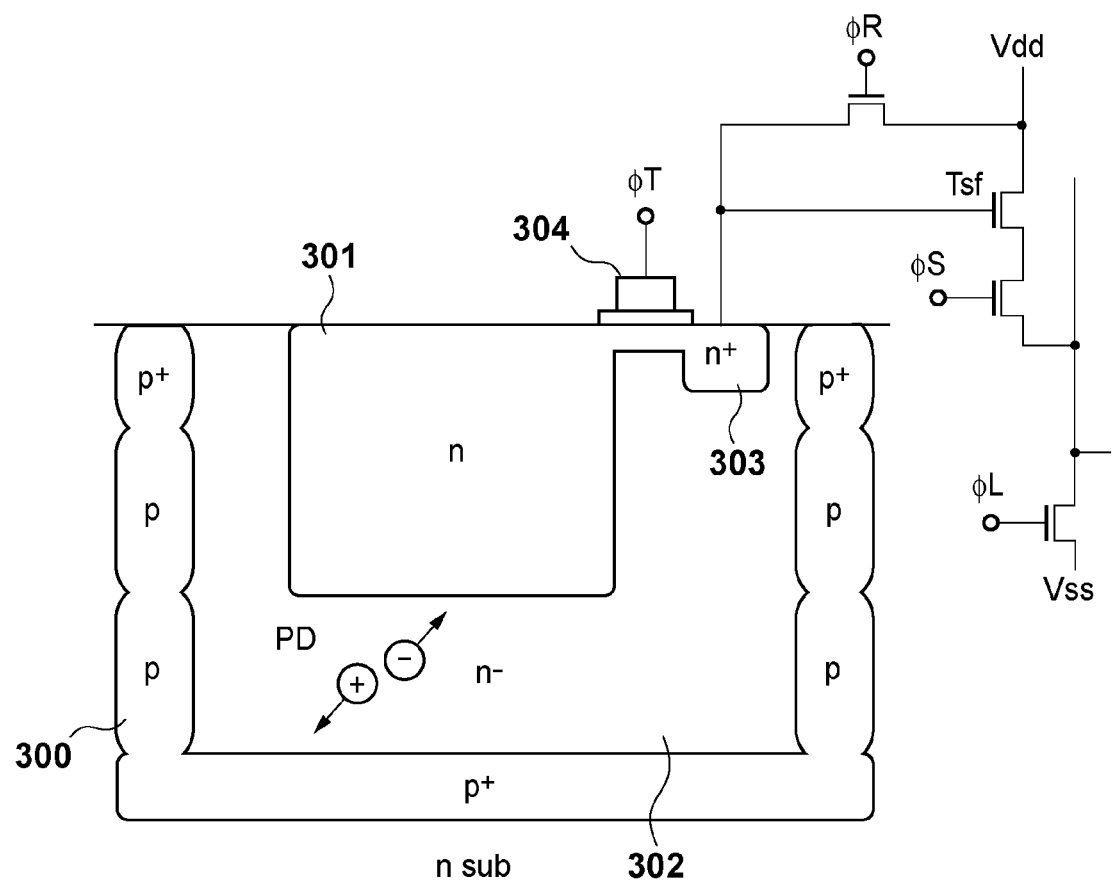
FIG. 6 is a schematic circuit diagram of the pixel of the image sensor in the first embodiment of the present invention.

Accumulation operation control of each pixel will be described. FIG. 6 is a schematic circuit diagram of the imaging pixel 220G shown in FIGS. 5A and 5B. The same reference numerals as in FIGS. 5A and 5B denote the same constituent elements in FIG. 6. Reference numeral 300 denotes a p-type layer; 301, an n-type layer; 302, an n-intrinsic layer; 303, an n-type charge-accumulating layer; and 304, a transfer gate, and reference symbol Tsf denotes a source follower MOS transistor. Also, reference symbols Vdd and Vss (Vdd>Vss) denote power supply voltages; φT, a transfer gate voltage; φR, a reset gate voltage; φS, a pixel select gate voltage; and φL, a line select gate voltage.

First, to reset the photoelectric conversion unit PD of each pixel, the transfer gate voltages φT and reset gate voltages φR on all rows are simultaneously turned on. The moment the transfer gate voltages φT and reset gate voltages φR are simultaneously turned off, an accumulation operation starts so that charges are accumulated in the n-type layer 301 in correspondence with the amount of light received by the photoelectric conversion unit PD of each pixel. After accumulation has been performed for a desired time, the transfer gate voltages φT on all rows are turned on and turned off again so that signal charges in each pixel are transferred at once from the n-type layer 301 to the n-type charge-accumulating layer 303 of this pixel. The select gate voltage φS is turned on/off for each row so that the signal charges transferred to the n-type charge-accumulating layer 303 are sequentially read out for each row. Also, columns from which signals are to be read can be sequentially selected by turning on/off the line select gate voltages φL. Accumulation operation control of the focusing pixels 220SA and 220SB is done in the same way upon replacement of the n-type charge-accumulating layer 303 in the above description with the n-type charge-accumulating layers 303a and 303b, respectively.

The charges $Q_{IMG}$ accumulated in the n-type layer 301 of the imaging pixel 220G are transferred to the n-type charge-accumulating layer 303 under the control of the transfer gate 304, amplified by a source follower circuit, and converted into a voltage signal $V_{IMG}$. Similarly, the charges $Q_{AF}$ accumulated in the n-type layer 301 of each of the focusing pixels 220SA and 220SB are transferred to a corresponding one of the n-type charge-accumulating layers 303a and 303b under the control of the transfer gate 304, amplified by a source follower circuit, and converted into a voltage signal $V_{AF}$.

The correspondence between pupil division and the opening 310a' or 310b' in the light-shielding layer 310a or 310b of each pixel will be described with reference to FIGS. 7A to 7C. FIGS. 7A and 7B show the relationships between the exit pupil plane of the imaging optical system and vertical sectional views of the focusing pixels 220SA and 220SB shown in FIGS. 3B and 4B, respectively. Also, FIG. 7C shows the relationship between the exit pupil plane of the imaging optical system and a vertical sectional view of the imaging pixel 220G. Note that the x- and y-axes of the sectional views in FIGS. 7A to 7C are interchanged in FIGS. 3A and 3B, 4A and 4B, and 5A and 5B, respectively, for the sake of easy viewing of the correspondences with the coordinate axes of the exit pupil plane.

The exit pupil plane shown in FIGS. 7A to 7C has an exit pupil 400 of the imaging optical system, a pupil intensity distribution range 500 of the imaging pixel 220G, a pupil intensity distribution range 511 of the focusing pixel 220SA, and a pupil intensity distribution range 521 of the focusing pixel 220SB.

A light flux from the object passes through the exit pupil 400 of the imaging optical system, and enters each pixel.

Referring to FIG. 7C, the pupil intensity distribution range 500 of the imaging pixel 220G uses the microlens 305 to maintain an approximately conjugate relationship with the light-receiving surface of the photoelectric conversion unit PD, and represents a pupil area (first pupil area) in which the imaging pixel 220G can receive light. The pupil distance is several tens of millimeters, while the diameter of the microlens 305 is several micrometers. Hence, the microlens 305 has an aperture value of several tens of thousands, thus generating a diffraction blur on the order of several tens of millimeters. When this happens, an image on the light-receiving surface of the photoelectric conversion unit PD does not become clear but has a given light-reception ratio distribution range.

The pupil intensity distribution range 500 of the imaging pixel 220G is set so that the light-receiving region is as wide as possible to allow the imaging pixel 220G to receive a larger amount of light flux having passed through the exit pupil 400, and the center of gravity of the pupil intensity distribution range 500 of the imaging pixel 220G approximately coincides with the optical axis.

Referring to FIG. 7A, the pupil intensity distribution range 511 of the focusing pixel 220SA uses the microlens 305 to maintain an approximately conjugate relationship with the opening 310a' in the light-shielding layer 310a having a center of gravity that is shifted in the −x direction, and represents a pupil area in which the focusing pixel 220SA can receive light. The pupil intensity distribution range 511 of the focusing pixel 220SA has a light-receiving region narrower than the pupil intensity distribution range 500 of the imaging pixel 220G, and has a center of gravity that is shifted in the +x direction.

On the other hand, referring to FIG. 7B, the pupil intensity distribution range 521 of the focusing pixel 220SB uses the microlens 305 to maintain an approximately conjugate relationship with the opening 310b' in the light-shielding layer 310b having a center of gravity that is shifted in the +x direction, and represents a pupil area in which the focusing pixel 220SB can receive light. The pupil intensity distribution range 521 of the focusing pixel 220SB has a light-receiving region narrower than the pupil intensity distribution range 500 of the imaging pixel 220G, and has a center of gravity that is shifted in the −x direction on the pupil plane, that is, in the direction opposite to that in the focusing pixel 220SA. The pupil areas of the imaging optical system, which correspond to the focusing pixels 220SA and 220SB, will be collectively referred to as a second pupil area hereinafter.

Figure 8A:
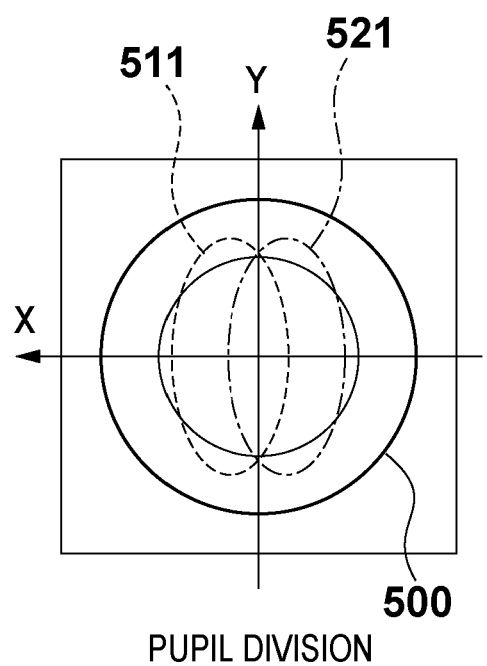
FIGS. 8A and 8B are views illustrating examples of the overview of pupil division and the pupil intensity distribution of the image sensor in the first embodiment of the present invention.
Figure 8B:
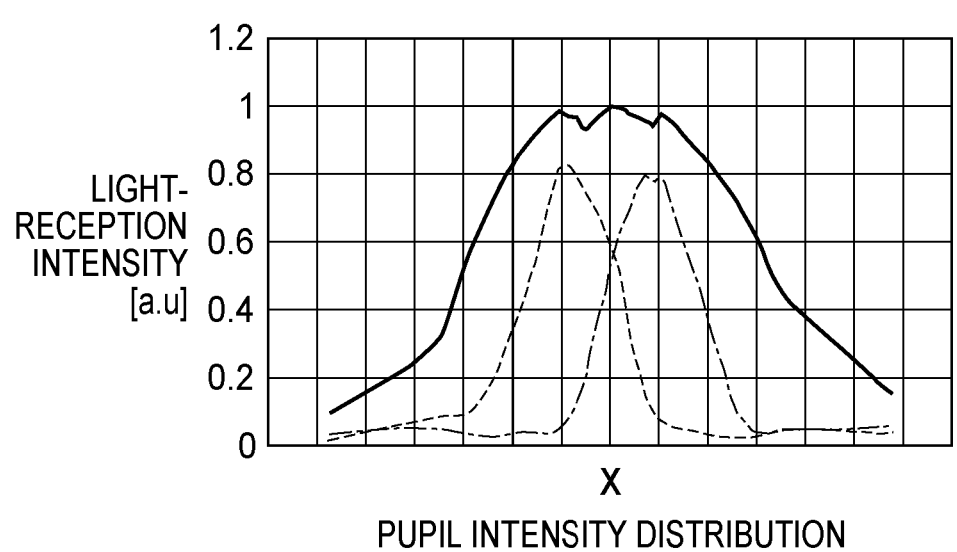

FIG. 8A shows the relationships among the pupil intensity distribution range 511 of the focusing pixel 220SA, the pupil intensity distribution range 521 of the focusing pixel 220SB, and the pupil intensity distribution range 500 of the imaging pixel 220G. Also, FIG. 8B illustrates an example of the pupil intensity distribution range along the x-axis in the exit pupil using a broken curve for the focusing pixel 220SA, an alternating long and short dashed curve for the focusing pixel 220SB, and a solid curve for the image sensor 107. Each of the pupil intensity distribution range of the focusing pixel 220SA and that of the focusing pixel 220SB is obtained by dividing the exit pupil in the x-axis direction. Similarly, when the center of gravity of the opening 310a' or 310b' in the light-shielding layer 310a or 310b is shifted in the y-axis direction, the exit pupil can be divided in the y-axis direction.

As shown in FIG. 2, an object image obtained from focusing pixels 220SA regularly arrayed in the x-axis direction is defined as image A. Similarly, an object image obtained from focusing pixels 220SB regularly arrayed in the x-axis direction is defined as image B. By detecting the defocus amount (relative position) between images A and B, the defocus amount (focus offset amount) of an object image having a luminance distribution in the x-axis direction can be detected.

The center of gravity of the pupil intensity distribution range 511 of the focusing pixel 220SA shown in FIG. 7A, which is inside the exit pupil 400 of the imaging optical system, is defined as CA, and that of the pupil intensity distribution range 521 of the focusing pixel 220SB shown in FIG. 7B, which is inside the exit pupil 400, is defined as CB. The base line length is defined as an interval CA-CB between these two centers of gravity. As the absolute value of the base line length increases, the defocus amount between images A and B with respect to the defocus amount of the object image increases, thus improving the focus detection accuracy.

[Method of Determining Capacitance of N-Type Charge-Accumulating Layer]

In the first embodiment, G filters identical to that of the imaging pixel 220G are formed in both the focusing pixels 220SA and 220SB, so the color filters of these pixels have the same spectral transmittance. The imaging pixel 220G has a pupil area larger than those of the focusing pixels 220SA and 220SB. Therefore, when these pixels receive the same amount of incident light, charges $Q_{IMG}$ generated by the imaging pixel 220G are larger in amount than charges $Q_{AF}$ generated by each of the focusing pixels 220SA and 220SB.

Assume that a capacitance $Q_{IMG}$ of the n-type charge-accumulating layer 303 of the imaging pixel 220G is equal to a capacitance $C_{AF}$ of each of the n-type charge-accumulating layers 303a and 303b of the focusing pixels 220SA and 220SB, respectively. In this case, the n-type charge-accumulating layer 303 of the imaging pixel 220G is saturated earlier, thus generating a difference in saturation capacitance between the imaging pixel 220G and each of the focusing pixels 220SA and 220SB.

A condition to equalize the saturation capacitances of the imaging pixel and focusing pixel is described by:

$$\frac{Q_{IMG}}{C_{IMG}} = \frac{Q_{AF}}{C_{AF}} \quad (1)$$

From equation (1), we have:

$$\frac{C_{AF}}{C_{IMG}} = \frac{Q_{AF}}{Q_{IMG}} = \frac{\eta_{AF}}{\eta_{IMG}} \quad (2)$$

where $\eta_{IMG}$ is the light-reception efficiency of the imaging pixel 220G, and $\eta_{AF}$ is the light-reception efficiency of each of the focusing pixels 220SA and 220SB.

Hence, to reduce the difference in saturation capacitance between the imaging pixel 220G and each of the focusing pixels 220SA and 220SB, a capacitance ratio $Q_{AF}/Q_{IMG}$ obtained by dividing the capacitance of each of the n-type charge-accumulating layers 303a and 303b of the focusing pixels 220SA and 220SB, respectively, by that of the n-type charge-accumulating layer 303 of the imaging pixel 220G need only be nearly equal to a light-reception efficiency ratio $\eta_{AF}/\eta_{IMG}$ obtained by dividing the light-reception ratio of each of the focusing pixels 220SA and 220SB by that of the imaging pixel 220G.

Upon the above-mentioned operation, in this embodiment, the capacitance $C_{IMG}$ of the n-type charge-accumulating layer 303 of the imaging pixel 220G is made different from the capacitance $C_{AF}$ of each of the n-type charge-accumulating layers 303a and 303b of the focusing pixels 220SA and 220SB, respectively. This makes it possible to reduce the difference in saturation capacitance between the imaging pixel 220G and each of the focusing pixels 220SA and 220SB.

More specifically, in the first embodiment, the capacitance $C_{IMG}$ of the n-type charge-accumulating layer 303 of the imaging pixel 220G is set higher than the capacitance $C_{AF}$ of each of the n-type charge-accumulating layers 303a and 303b of the focusing pixels 220SA and 220SB, respectively.

However, in the first embodiment, to perform focus detection of the phase-difference detection method, the position of center of gravity of the pupil intensity distribution area (pupil area) of the imaging pixel 220G is different from those of the pupil areas of the focusing pixels 220SA and 220SB. Due to the difference in position of center of gravity of the pupil area, the light-reception efficiency ratio $\eta_{AF}/\eta_{IMG}$ between the imaging pixel 220G and each of the focusing pixels 220SA and 220SB considerably varies with changes in image height, exit pupil distance, and aperture value of the imaging optical system.

Figure 9:
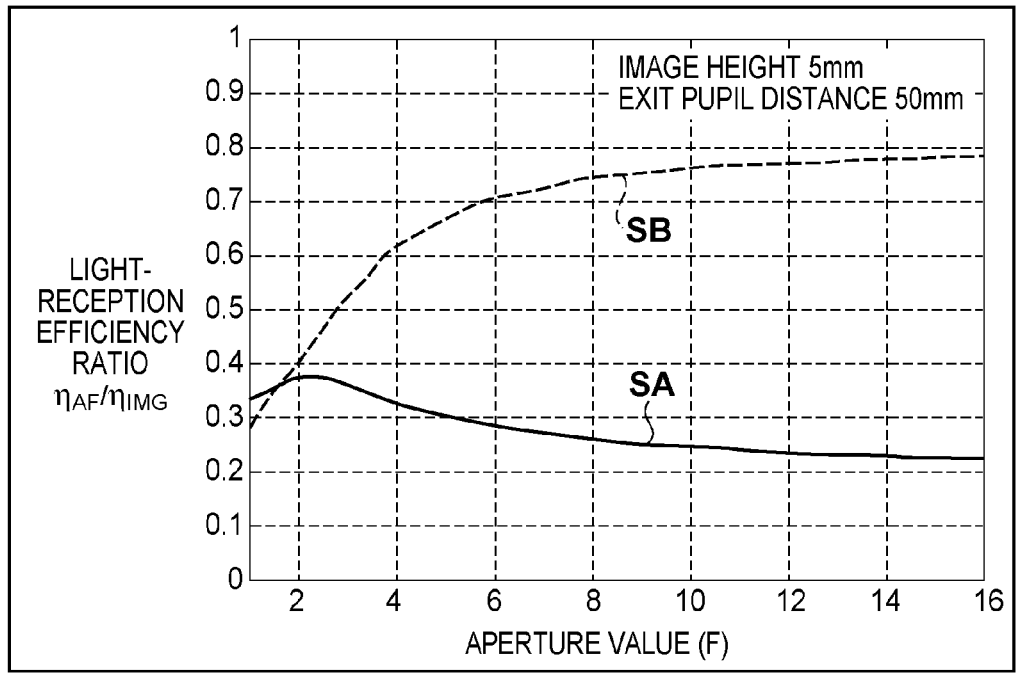
FIG. 9 is a graph illustrating an example of the relationship between the aperture value and the light-reception efficiency ratio between the imaging pixel and the focusing pixel.
Figure 10:
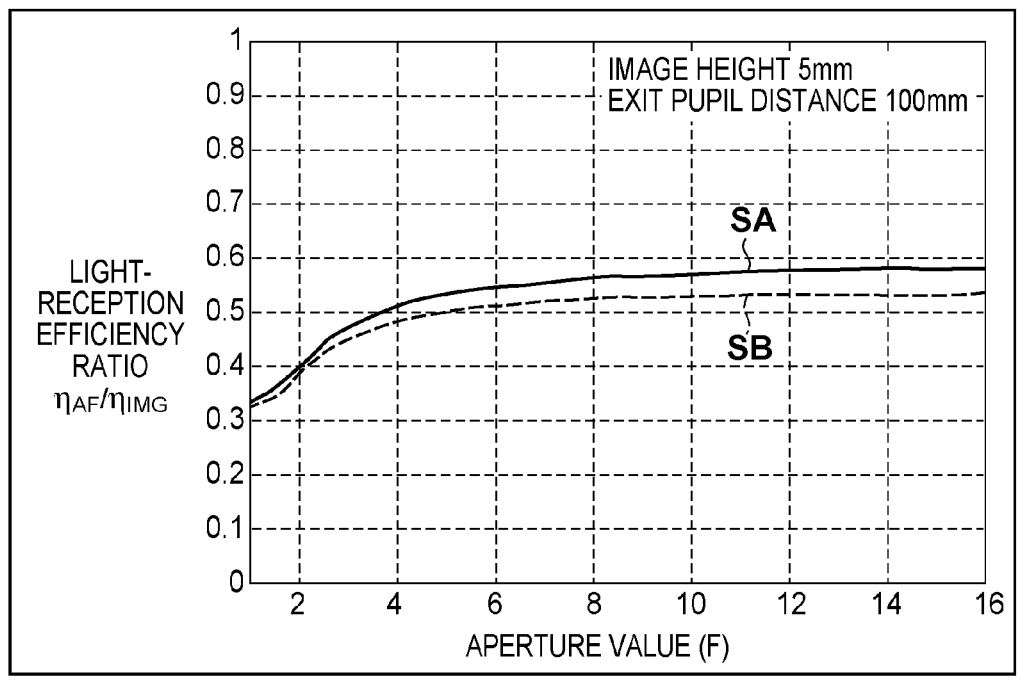
FIG. 10 is a graph illustrating another example of the relationship between the aperture value and the light-reception efficiency ratio between the imaging pixel and the focusing pixel.
Figure 11:
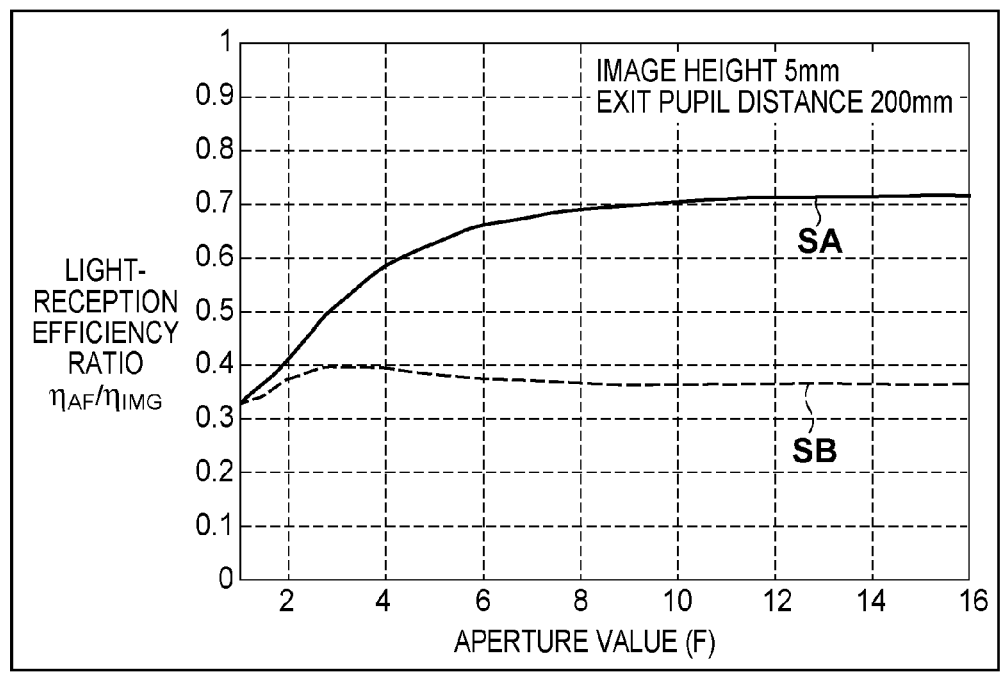
FIG. 11 is a graph illustrating still another example of the relationship between the aperture value and the light-reception efficiency ratio between the imaging pixel and the focusing pixel.

FIGS. 9 to 11 show detailed examples of the relationships between the aperture value F and the light-reception efficiency ratio $\eta_{AF}/\eta_{IMG}$ between the imaging pixel 220G and each of the focusing pixels 220SA and 220SB at an image height around 5 mm from the sensor center. The aperture value F is shown on the abscissa, the light-reception efficiency ratio $\eta_{AF}/\eta_{IMG}$ is shown on the ordinate, the light-reception efficiency ratio between the imaging pixel 220G and the focusing pixel 220SA (a focusing pixel for image A) is indicated by a solid curve, and the light-reception efficiency ratio between the imaging pixel 220G and the focusing pixel 220SB (a focusing pixel for image B) is indicated by a broken curve. FIG. 9 shows the case wherein the exit pupil distance of the imaging optical system is 50 mm, FIG. 10 shows the case wherein the exit pupil distance of the imaging optical system is 100 mm, and FIG. 11 shows the case wherein the exit pupil distance of the imaging optical system is 200 mm.

As is obvious from FIG. 9, the light-reception efficiency ratio between the imaging pixel 220G and the focusing pixel 220SB considerably varies from about 0.3 to about 0.8 with a change in aperture value F. Also, as is obvious from FIGS. 9 to 11, the light-reception efficiency ratio between the imaging pixel 220G and the focusing pixel 220SB considerably varies from about 0.2 to about 0.8 with a change in exit pupil distance of the imaging optical system. Furthermore, as is obvious from FIGS. 9 and 11, the light-reception efficiency ratio between the imaging pixel 220G and the focusing pixel 220SA and that between the imaging pixel 220G and the focusing pixel 220SB vary in opposite patterns with a change in aperture value F depending on the exit pupil distance.

Assume that the ratio between the capacitance of the n-type charge-accumulating layer 303 and that of each of the n-type charge-accumulating layer 303a (303b) $Q_{AF}/Q_{IMG}$ is determined in accordance with the above-mentioned equation (2) based on the minimum value at which the light-reception efficiency ratio $\eta_{AF}/\eta_{IMG}$ between the imaging pixel 220G and the focusing pixels 220SA (220SB) is closest to zero. In this case, as the light-reception efficiency ratio increases with changes in exit pupil distance and aperture value F of the imaging optical system, excessive correction in which the focusing pixels 220SA and 220SB are saturated earlier than the imaging pixel 220G occurs. If excessive correction is done in a large amount, the difference in saturation capacitance between the imaging pixel 220G and each of the focusing pixels 220SA and 220SB may become larger than that before correction.

Therefore, among the values of the light-reception efficiency ratio between the imaging pixel 220G and each of the focusing pixels 220SA and 220SB within predetermined ranges of the exit pupil distance and the aperture value F of the imaging optical system, a value (maximum value) closest to one is obtained. In accordance with this value of the light-reception efficiency ratio and equation (2), the ratio between the capacitance $C_{IMG}$ of the n-type charge-accumulating layer 303 and the capacitance $C_{AF}$ of each of the n-type charge-accumulating layers 303a and 303b is determined. This makes it possible to avoid excessive correction of the saturation capacitances if the light-reception efficiency ratio has varied.

Figure 12:
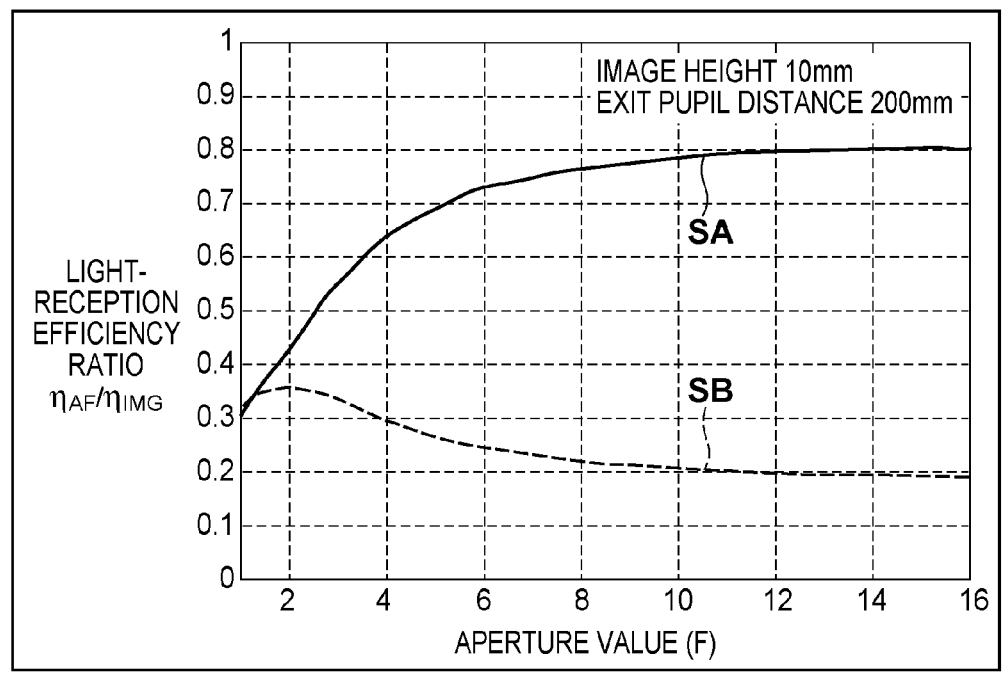
FIG. 12 is a graph illustrating still another example of the relationship between the aperture value and the light-reception efficiency ratio between the imaging pixel and the focusing pixel.

FIG. 12 illustrates a detailed example of the relationship between the aperture value and the light-reception efficiency ratio between the imaging pixel 220G and each of the focusing pixels 220SA and 220SB at an image height around 10 mm from the sensor center when the exit pupil distance of the imaging optical system is 200 mm. The aperture value is shown on the abscissa, the light-reception efficiency ratio is shown on the ordinate, the light-reception efficiency ratio between the imaging pixel 220G and the focusing pixel 220SA (a focusing pixel for image A) is indicated by a solid curve, and the light-reception efficiency ratio between the imaging pixel 220G and the focusing pixel 220SB (a focusing pixel for image B) is indicated by a broken curve. As is obvious from FIGS. 11 and 12, the light-receiving efficiency ratios before and after the sensor image height alone is changed can be compared.

As can be seen from a comparison between FIGS. 11 and 12, the light-reception efficiency ratio $\eta_{AF}/\eta_{IMG}$ between the imaging pixel and the focusing pixel considerably varies with a change in sensor image height as well.

A variation in light-reception efficiency ratio with a change in image height can even be coped with by determining the ratio between the capacitance $C_{IMG}$ of the n-type charge-accumulating layer 303 and the capacitance $C_{AF}$ of each of the n-type charge-accumulating layers 303a and 303b in accordance with the sensor image height on the predicted imaging surface of the imaging optical system. More specifically, the capacitance ratio need only be determined in accordance with a value closest to one among the values of the light-reception efficiency ratio when the aperture value and the exit pupil distance are changed within predetermined ranges for each sensor image height. The interval at which the capacitance ratio is changed for a given sensor image height can be appropriately determined. This interval may remain the same or be changed depending on the image height.

The method of determining a detailed capacitance value from the capacitance ratio is not limited. However, as the capacitance of each of the n-type charge-accumulating layers 303a and 303b of the focusing pixels is reduced to enhance the sensitivity, the S/N ratio of each focusing pixel in a low-illuminance region can be improved, and the focus detection accuracy, in turn, can be improved.

As described above, according to this embodiment, the ratio between the capacitance of the charge-accumulating layer of the imaging pixel and that of the charge-accumulating layer of the focusing pixel is determined in consideration of a variation in light-reception efficiency ratio due to changes in at least aperture value and exit pupil distance. This makes it possible to satisfactorily reduce the difference in saturation capacitance due to the difference between the light-reception efficiencies of the imaging pixel and focusing pixel.

Further, a greater reduction effect can be obtained by determining this capacitance ratio in accordance with the image height.

Second Embodiment

In the first embodiment, G filters are formed in the focusing pixels 220SA and 220SB shown in FIG. 2, as in the imaging pixel 220G. In contrast to this, in the second embodiment, focusing pixels 220SA and 220SB serve as W (White) pixels, instead of forming color filters in them.

FIG. 13A is a plan view of the focusing pixel 220SA of the second embodiment when viewed from the side of the light-receiving surface of an image sensor 107 (+z side), and FIG. 13B is a sectional view taken along a cross-section a-a in FIG. 13A when viewed from the –y side. Because no color filter is formed in the focusing pixel 220SA in this embodiment, light-reception efficiency can be improved. Note that the focusing pixel 220SB has the same structure as the focusing pixel 220SA except that a light-shielding layer 310b in the former has an opening position different from a light-shielding layer 310a in the latter.

In this embodiment, a G filter is formed in an imaging pixel 220G, while no color filters are formed in the focusing pixels 220SA and 220SB. This means that the focusing pixels 220SA and 220SB have a light transmittance higher than the imaging pixel 220G. Accordingly, the imaging pixel 220G has a larger pupil area, but each of the focusing pixels 220SA and 220SB may generate a larger amount of charges when these pixels receive the same amount of incident light.

Hence, in this embodiment, a capacitance $C_{IMG}$ of an n-type charge-accumulating layer 303 of the imaging pixel 220G is set lower than a capacitance $C_{AF}$ of each of n-type charge-accumulating layers 303a and 303b of the focusing pixels 220SA and 220SB.

In this embodiment, with changes in exit pupil distance and aperture value F of the imaging optical system, the light-reception efficiency ratio between the focusing pixel and the imaging pixel becomes both not less than and not more than one. Therefore, the average value of the light-reception efficiency ratios between the focusing pixel and the imaging pixel can be used in place of the value of the light-reception efficiency ratio, which is closest to one. Except for this respect, a capacitance ratio $C_{AF}/C_{IMG}$ can be determined in the same way as in the first embodiment.

According to this embodiment, it is possible not only to obtain the effect according to the first embodiment but also to enhance the light-reception efficiency of each focusing pixel and therefore to improve the S/N ratio of this focusing pixel, thereby improving the focus detection accuracy.

Third Embodiment

Figure 14:
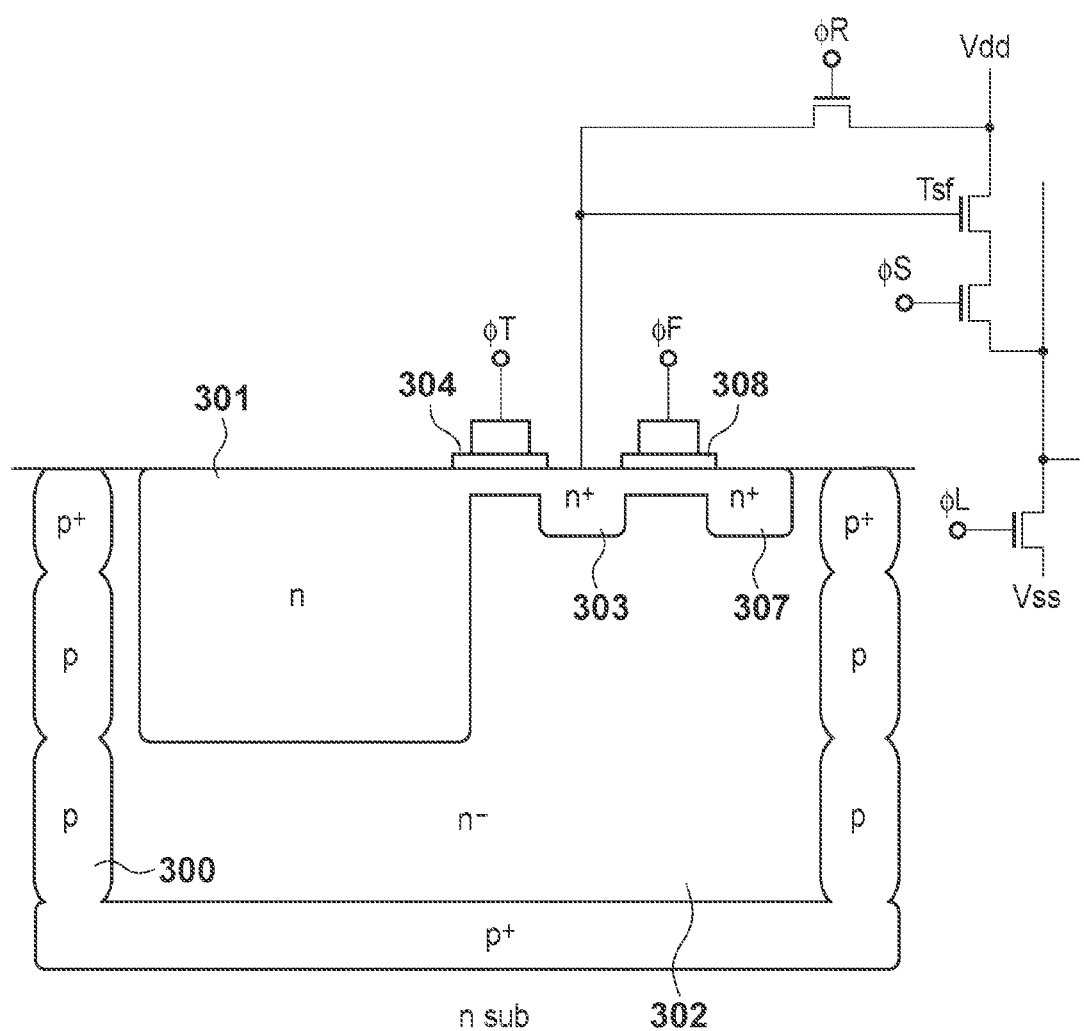
FIG. 14 is a schematic circuit diagram of the pixel of the image sensor in the third embodiment of the present invention.

FIG. 14 is a schematic circuit diagram of an imaging pixel 220G according to the third embodiment. The same reference numerals as in FIG. 6 denote the same constituent elements in FIG. 14, and a repetitive description thereof will not be given. The imaging pixel 220G according to this embodiment has a feature in that an n-type charge-accumulating layer 303 is connected to an additional n-type charge-accumulating layer 307 via a capacitance adjusting gate 308.

Hence, an effective charge-accumulating layer of a source follower circuit in this embodiment is formed by combining the n-type charge-accumulating layer 303 and the additional n-type charge-accumulating layer (additional charge-accumulating layer) 307. When a capacitance adjusting gate voltage φF is turned off, only the n-type charge-accumulating layer 303 is enabled, so the combined capacitance of all the charge-accumulating layers decreases. On the other hand, when the capacitance adjusting gate voltage φF is turned on, the n-type charge-accumulating layer 307 is also enabled, so the combined capacitance of all the charge-accumulating layers increases.

The pixel arrangement shown in FIG. 14 is similarly applicable to focusing pixels 220SA and 220SB. In this case, the n-type charge-accumulating layer 303 is replaced with n-type charge-accumulating layers 303a and 303b.

In this manner, the imaging pixel 220G and the focusing pixels 220SA and 220SB in this embodiment have the following feature. That is, n-type charge-accumulating layers are formed by a plurality of n-type charge-accumulating layers 303/303a/303b and 307 and a gate electrode (capacitance adjusting gate 308) which varies the capacitances of these layers. With this arrangement, the capacitance of each n-type charge-accumulating layer is made variable.

Note that to keep pace with pixel miniaturization, it is possible to set the light-receiving area of the photoelectric conversion unit of each of the focusing pixels 220SA and 220SB smaller than that of the photoelectric conversion unit of the imaging pixel 220G, and apply the arrangement shown in FIG. 14 to only the focusing pixels 220SA and 220SB. In other words, neither a capacitance adjusting gate 308 nor an n-type charge-accumulating layer 307 is formed in the imaging pixel 220G (or the n-type charge-accumulating layer 307 serving as an additional charge-accumulating layer is not enabled).

Although the ratio between the capacitance of the charge-accumulating layer of the imaging pixel 220G and that of each of the focusing pixels 220SA and 220SB cannot be dynamically varied in the first and second embodiments, this can be done in this embodiment.

Hence, capacitance ratios like those determined in the first and second embodiments are determined in a number equal to the number of combinations of capacitance ratios that can be attained by control of the capacitance adjusting gate 308 for one of the aperture value F, the exit pupil distance, and the image height and, for example, for the aperture value F. The capacitances of the n-type charge-accumulating layers 303 and 307 are determined so as to attain the determined capacitance ratios, and the capacitance adjusting gate 308 is controlled in accordance with the aperture value F by a control circuit (not shown).

When the arrangement shown in FIG. 14 is applied to, for example, only the focusing pixels 220SA and 220SB, two capacitance ratios $C_{AF}/C_{IMG}$ can be attained. When the method according to the first embodiment is employed, two capacitance ratios are determined within the variable range of the aperture value F. For example, two capacitance ratios are determined from the values of the light-reception efficiency ratio, which are closest to one within first and second ranges, respectively, of the aperture value F, and specific values of the capacitances of the n-type charge-accumulating layers 303 and 307 are determined so that the individual capacitance ratios can be attained. The capacitance adjusting gate 308 is turned on/off in accordance with the aperture value in actual use, thereby attaining the capacitance ratio between the imaging pixel 220G and each of the focusing pixels 220SA and 220SB corresponding to this aperture value. The capacitance ratio may be varied in accordance with the exit pupil distance in place of the aperture value F.

Note that when the capacitance ratio is varied in accordance with the image height as well, a plurality of capacitance ratios can be determined using the above-mentioned method for each image height.

In the above-mentioned example, one set of a capacitance adjusting gate 308 and an additional n-type charge-accumulating layer 307 is provided for the sake of easy explanation and understanding. However, as can be easily understood, it is theoretically possible to provide two or more sets of a capacitance adjusting gates 308 and an additional n-type charge-accumulating layer 307 to allow control with higher accuracy. It is also possible to set a variable capacitance value even in the imaging pixel 220G, thereby attaining a larger number of combinations of capacitance ratios.

Also, in this embodiment, it can be arbitrarily determined whether color filters are to be formed in the focusing pixels 220SA and 220SB. If no color filters are formed in these pixels, the capacitance ratio can be determined using the method described in the second embodiment.

In this manner, according to this embodiment, when the capacitance of the charge-accumulating layer is made dynamically variable, it is possible not only to obtain the effect according to the first or second embodiment but also to more satisfactorily reduce the difference in saturation capacitance due to the difference between the light-reception efficiencies of the imaging pixel and the focusing pixel.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-079799, filed on Mar. 31, 2011, which is hereby incorporated by reference herein in its entirety.

What is claimed is:

1. An image sensor comprising:
an imaging pixel which includes a first charge-accumulating layer and receives a light flux that passes through a first pupil area of an imaging optical system, and
a focusing pixel which includes a second charge-accumulating layer and receives a light flux that passes through a second pupil area of the imaging optical system,
wherein the focusing pixel further comprises a light-shielding layer which includes an opening and is formed therein so that the first pupil area is larger than the second pupil area, and the first pupil area has a position of center of gravity different from a position of center of gravity of the second pupil area, and
wherein a ratio between a capacitance of the first charge-accumulating layer and a capacitance of the second charge-accumulating layer has a value determined in accordance with one of an average value and a value closest to one, of a ratio between light-reception efficiency of the imaging pixel and light-reception efficiency of the focusing pixel, the ratio varies depending on a change in at least one of an exit pupil distance and an aperture value of the imaging optical system.

2. The sensor according to claim 1, wherein the ratio between the capacitances of the first and second charge-accumulating layers is determined in accordance with an image height of the image sensor.

3. The sensor according to claim 1, wherein the capacitance of the first charge-accumulating layer is higher than the capacitance of the second charge-accumulating layer.

4. The sensor according to claim 1, wherein
the second charge-accumulating layer comprises a plurality of charge-accumulating layers and at least one gate electrode which adjusts a combined capacitance of the plurality of charge-accumulating layers, and
a ratio between the capacitance of the first charge-accumulating layer and the combined capacitance of the second charge-accumulating layer has the same numbers of values as the number of combinations of the combined capacitance, which can be realized by controlling of the gate electrode, in a variable range of one of the exit pupil distance and the aperture value of the imaging optical system.

5. An image-capturing apparatus comprising an image sensor, as defined in claim 1.

* * * * *